United States Patent [19]
Rohde et al.

[11] Patent Number: 5,801,328
[45] Date of Patent: Sep. 1, 1998

[54] CABLE EMI SHIELD TERMINATION AND ENCLOSURE

[75] Inventors: Sheldon L. Rohde, Allen, Tex.; Michael W. Kement, North Boro, Mass.; Michael K. Pratt, Plano; Felipe D. Mendoza, Dallas, both of Tex.

[73] Assignee: DSC Communications Corporation, Plano, Tex.

[21] Appl. No.: 385,465

[22] Filed: Feb. 8, 1995

(Under 37 CFR 1.47)

[51] Int. Cl.⁶ ........................................... H05K 9/00
[52] U.S. Cl. .................... 174/35 R; 439/942; 361/818
[58] Field of Search ..................... 174/35 R, 135, 174/72 R, 84 R, 93, 78, 74 R, 75 C, 88 C, 89, 73.1; 439/607, 608, 609, 610, 98, 942; 361/816, 817, 818, 788, 789; 29/729

[56] References Cited

U.S. PATENT DOCUMENTS

| | | | |
|---|---|---|---|
| 2,435,284 | 2/1948 | Lodge | 174/84 |
| 3,587,028 | 6/1971 | Uberbacher | 339/14 |
| 4,711,519 | 12/1987 | Smulders | 350/96.2 |
| 4,744,627 | 5/1988 | Chande et al. | 350/96.2 |
| 4,765,700 | 8/1988 | Ito | 350/96.2 |
| 4,822,956 | 4/1989 | Sepe | 174/103 |
| 5,044,719 | 9/1991 | Nakamura | 385/76 |
| 5,109,460 | 4/1992 | Baek et al. | 385/115 |
| 5,125,057 | 6/1992 | Aberson, Jr. et al. | 385/65 |
| 5,146,532 | 9/1992 | Hodge | 385/136 |
| 5,214,735 | 5/1993 | Henneberger et al. | 385/136 |
| 5,239,609 | 8/1993 | Auteri | 385/136 |
| 5,281,762 | 1/1994 | Long et al. | 174/78 |
| 5,323,481 | 6/1994 | Tokumaru et al. | 385/136 |
| 5,473,117 | 12/1995 | Morgan et al. | 174/78 |

*Primary Examiner*—Kristine L. Kincaid
*Assistant Examiner*—Kristina Soderquist
*Attorney, Agent, or Firm*—Baker & Botts, L.L.P.

[57] ABSTRACT

The apparatus and method includes a backplane (14) and a plurality of cable connectors (16) arranged orderly on the backplane (14) to which the cables (12) are connected. A plurality of conductive groomer fingers (30) extend generally perpendicularly from the backplane (14) along at least one edge of the backplane (14), where slots of a predetermined width are defined therebetween. Each cable (12) has an EMI termination zone (32) packed in the groomer finger slots to achieve good electrical contact with the groomer fingers (30). A rear cover (34) is used to substantially enclose the backplane (14).

26 Claims, 3 Drawing Sheets

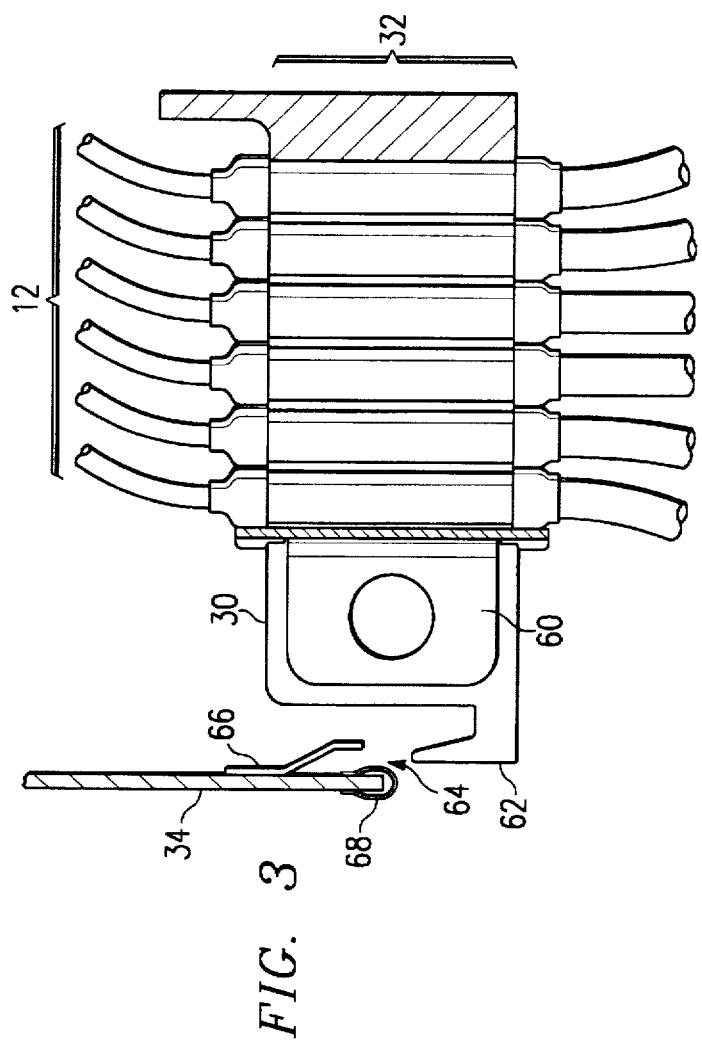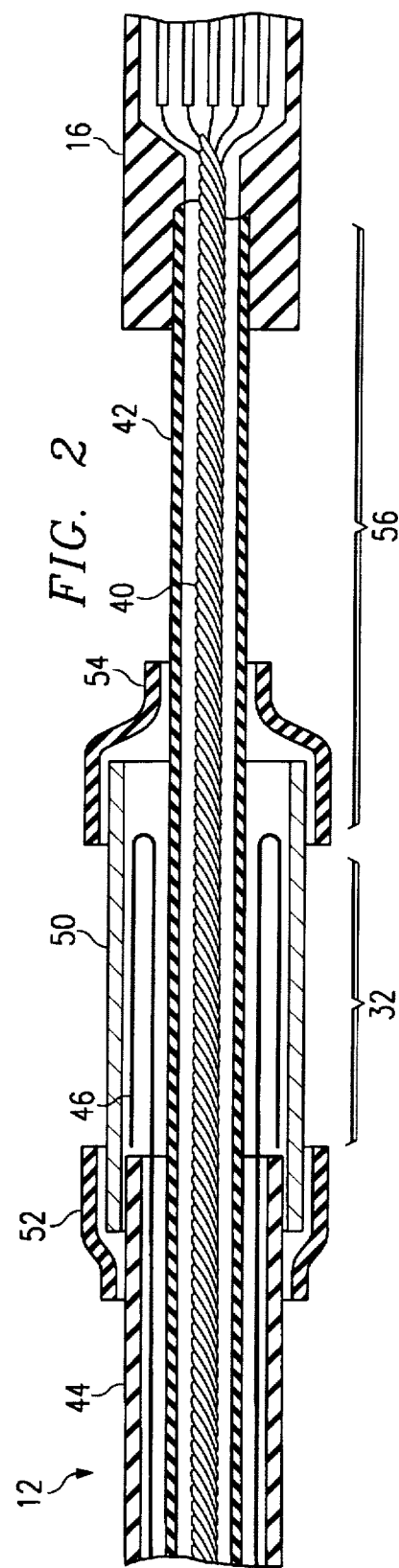

CABLE EMI SHIELD TERMINATION AND ENCLOSURE

TECHNICAL FIELD OF THE INVENTION

This invention relates in general to the field of EMI shielding. More particularly, the present invention is related to a cable EMI shield termination apparatus and method to perform the same.

BACKGROUND OF THE INVENTION

Electromagnetic interference (EMI) shielding of electronic and computer equipment has become increasing important as our airwaves become more crowded and polluted. In the field of telecommunications, successful shielding of highly sensitive electronic equipment from EMI has always been a challenge. The problem is further compounded by the large quantities of cables required to provide interconnections and routing between the many pieces of telecommunications equipment to transport telecommunications signals. These cables must be properly shielded and the EMI shields properly terminated when connected to a piece of equipment.

Typically, when cables are connected to a piece of equipment, specially designed and manufactured EMI termination connectors are used. These connectors are less than ideal because they are bulky and expensive to manufacture. When large quantities of cables are involved, as in telecommunications systems, these drawbacks are magnified to an unacceptable level.

SUMMARY OF THE INVENTION

From the foregoing, a need as arisen for a cost and space effective manner to terminate a large quantity of cables at the connection to a piece of equipment.

In accordance with the present invention, cable EMI termination apparatus and method are provided which eliminate or substantially reduce the disadvantages associated with prior apparatus and methods.

In one aspect of the invention, the apparatus includes a backplane and a plurality of cable connectors arranged orderly on the backplane to which the cables are connected. A plurality of conductive groomer fingers extend generally perpendicularly from the backplane along at least one edge of the backplane, where slots of predetermined width are defined therebetween. Each cable has an EMI termination zone that are packed in the groomer finger slots to achieve good electrical contact with the groomer fingers. A rear cover is used to substantially enclose the backplane.

In another aspect of the invention, a method of terminating the EMI shields of a large quantity of cables includes the steps of removing the outer layers of the EMI shielded cables, exposing an EMI shield layer of each cable at a termination zone defined therein, and removing the EMI shield layer of the cable beyond the termination zone forming unshielded cable portions. Then tightly pack the cables into the slots defined between the conductive groomer fingers extending from the electronic equipment, so that the exposed EMI shield at the termination zone of each cable is in good electrical contact with the conductive groomer fingers. Thereafter, a rear cover is used to enclose the backplane.

BRIEF DESCRIPTION OF THE DRAWINGS

For a better understanding of the present invention, reference may be made to the accompanying drawings, in which:

FIG. 2 is a detailed cross-sectional view of an EMI termination zone of a cable;

FIG. 3 is a detailed side view of the cable groomer taken along line 3—3 in FIG. 1;

DETAILED DESCRIPTION OF THE INVENTION

The preferred embodiment of the present invention and its advantages are best understood by referring to FIGS. 1–6 of the drawings, like numerals being used for like and corresponding parts of the various drawings.

Figure 1:
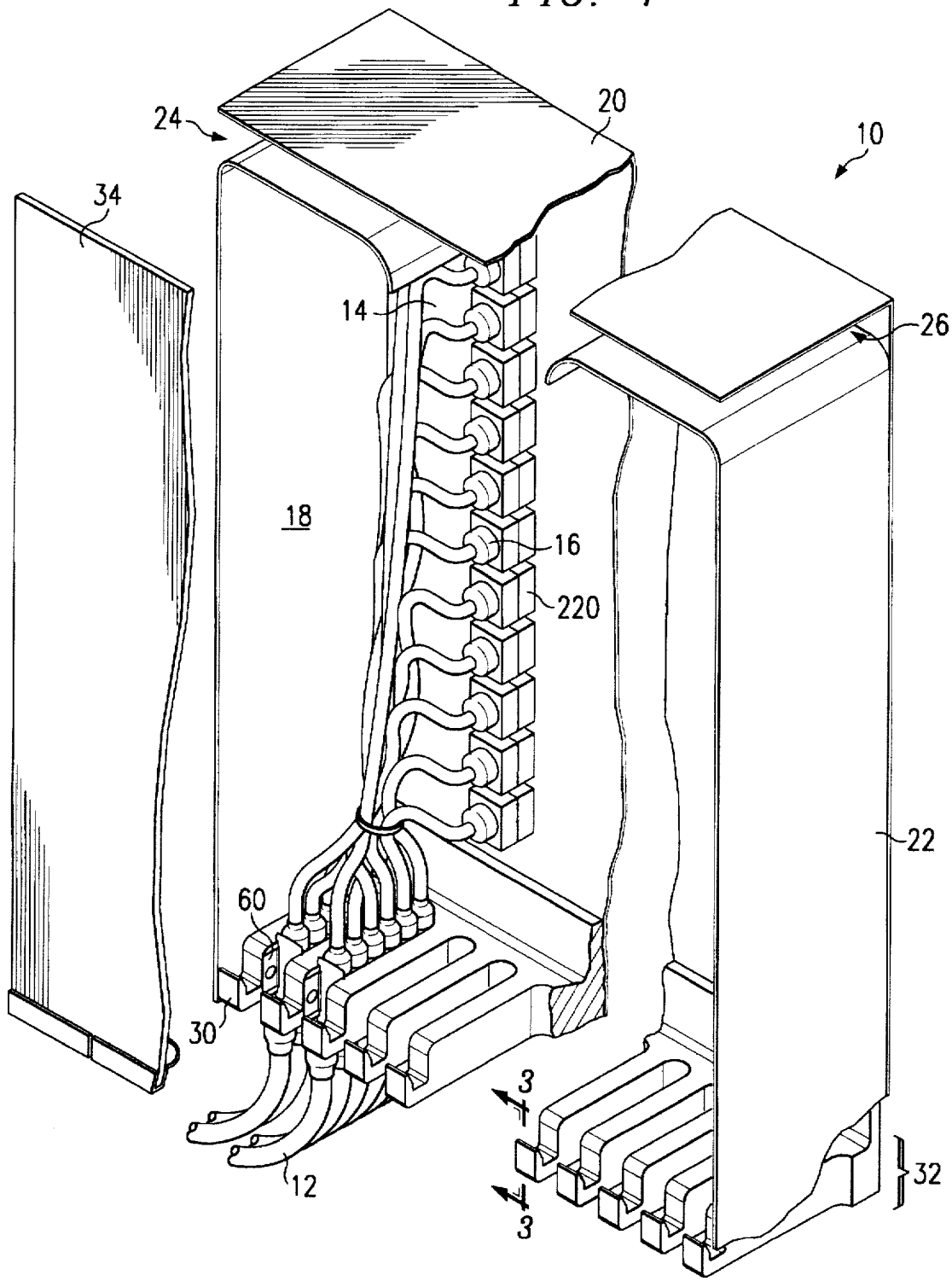
FIG. 1 is an isometric view of the EMI cable termination panel.

Referring to FIG. 1, an EMI shielded cable termination shelf enclosure 10 is shown. The shelf enclosure 10 may be installed on the back of an electronic equipment shelf for EMI shield terminating of a large quantity of EMI shielded cables 12. The shelf enclosure 10 includes a backplane 14 having a plurality of cable connectors 16 generally arranged in rows and columns. The cable connectors 16 may be conventional electrical connectors for I/O connection. The shelf enclosure 10 further includes three side walls 18–22 substantially enclosing the shelf 10 on three sides. Optional openings 24 and 26 are formed between the side walls 18–22, as shown, for access of optical cables. The openings 24 and 26 may be constructed with a long aspect ratio with respect to its maximum dimension so that mechanical means of EMI shielding is not required. The backplane 14 and side walls 18–22 may be constructed of a conductive sheet metal, such as stainless steel of the appropriate thickness.

A plurality of groomer fingers 30 are shown aligned and arranged along the fourth side of the shelf enclosure 10, although the groomer fingers 30 may be arranged along more than one edge of the backplane. The groomer fingers 30 are generally parallel with one another and define slots of a predetermined width therebetween. The finger array 30 may be fabricated from a conductive metal, such as nickel-plated aluminum alloy and materials of similar properties. As shown in FIG. 1, the cables 12 are connected to the cable connectors 16 on the backplane 14 and then neatly arranged and tightly pressed into the slots defined by the groomer fingers 30. The portion of the cables 12 which are in intimate contact with the groomer fingers 30 is referred to as the termination zone 32. Through the groomer fingers 30, the cables 12 pass to the exterior of the shelf enclosure 10 and are routed to other equipment. The manner in which the EMI shield is terminated in the groomer fingers 30 is described below while referencing FIGS. 2 and 3. A rear cover 34 is further provided to enclose the shelf enclosure 10.

Referring to FIG. 2, the structure and construction of the termination zone 32 of a cable 12 is shown in more detail. Note that the structures in FIG. 2 are slightly exploded for clarity. The termination zone 32 is fabricated by modifying the structure of a conventional cable 12, which typically include a plurality of signal conductors 40 protected by a cable inner jacket 42, which is further enclosed in an outer jacket 44. Between the inner and outer jackets 42 and 44 is a foil shield 46, which provides EMI shielding. At the termination zone 32, the cable outer jacket 44 is cut and terminated, thereby exposing the foil shield 46. As shown in FIG. 2, the foil shield 46 is also cut and folded over itself so that two layers of the foil shield 46 is wrapped around the cable inner jacket in the termination zone 32. An electrically conductive tape 50, such as a tin-plated copper tape, is then used to secure the double layers of foil shield and the loose end of the cable outer jacket 44 in the termination zone 32. To further provide the structural integrity of the termination zone 32, heat shrink sleeves 52 and 54 are used to cover and secure the two ends of the conductive tape 50, but the tape 50 remains exposed in the termination zone 32. Constructed in this manner, when the cables are tightly pressed in between the groomer fingers 30, the EMI shield 46 of the cable 12 is in good electrical contact with the fingers 30 to provide EMI shield termination.

Referring also to FIG. 3, the termination zones 32 of six cables 12 are shown pressed tightly into a slot defined between two groomer fingers 30. A stop or groomer clip 60 is used to securely hold the cables 12 in place, so that the foil shield 46 and conductive tap 50 remain in good electrical contact with the groomer fingers 30. The groomer clip 60 is discussed in more detail below with reference to FIG. 4.

The groomer fingers 30 also include a hooked end 62, which can be inserted into a channel 64 formed along the corresponding edge of the rear enclosure cover 34. The channel 64 is defined by a ledge 66 attached near the edge of the rear cover and extending the entire length of the rear cover 34. The ledge 66 projects slightly spaced from the edge of the rear cover 34, as shown, to form the channel 64. EMI shielding along this edge is provided by an EMI fingerstock 68 attached to the edge of the rear cover 34.

Figure 4:
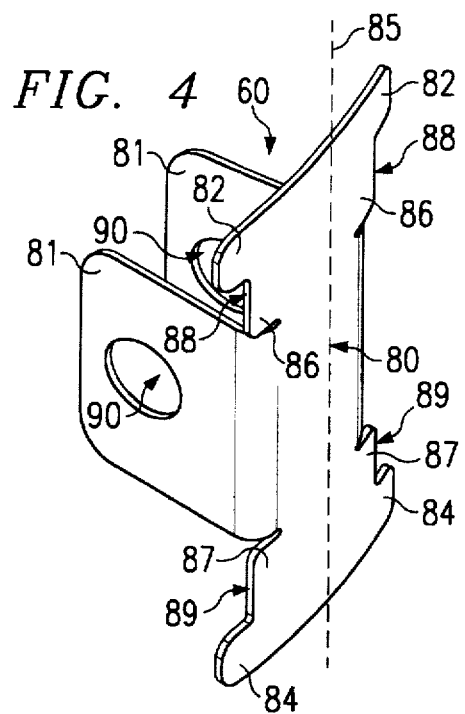
FIG. 4 is an isometric view of a cable groomer clip.

Referring to FIG. 4, the groomer clip 60 includes a back brace member 80 and two flanges 81 extending therefrom. The back brace member 80 includes upper and lower tabs 82 and 84 extending away from a longitudinal centerline 85 of the back brace member 80. In addition, the back brace member 80 further includes upper and lower extensions 86 and 87 which define biting edges 88 and 89, respectively. The back brace member 80 is further slightly curved along the centerline 85 with some flexibility in the curvature. Both flanges 81 extend generally perpendicularly from the back brace member 80, so that the back brace member 80 and the flanges 81 form a generally U-shaped structure. Note that the flanges 81 further extend slightly beyond the perpendicular toward each other. The flanges 81 each includes an opening 90, such as the round holes shown. The groomer clip 60 may be constructed from a thin sheet of metal, such as tin-plated beryllium copper or like materials suitable for the intended use described herein.

In operation, the groomer clip 60 is used to anchor the cables 12 in the slot formed by the groomer fingers 30. Because the back brace member 80 of the clip has a slight curvature, and the slot is dimensioned to be slightly narrower than the width of the curved back brace member 80, the back brace member 80 expands to the full width of the slot after the groomer clip 60 is pushed firmly against the cables 12 between the groomer fingers 30. Constructed in this manner, a spring effect is achieved to push the biting edges 88 and 89 against the sides of the groomer fingers 30 and firmly secure the clip in place. The upper and lower tabs 82 and 84 extend above and below the groomer fingers 30 to center the groomer clip 60 in the slot and prevent shifting of the clip 60 in the vertical direction. Removal of the groomer clip 60 is achieved by seizing the flanges 81 and pulling the clip 60 out of the slot. To facilitate the removal of the clip 60, round holes 90 are provided in the flanges to allow the insertion of a removal tool described in detail below with reference to FIG. 6.

Figure 5:
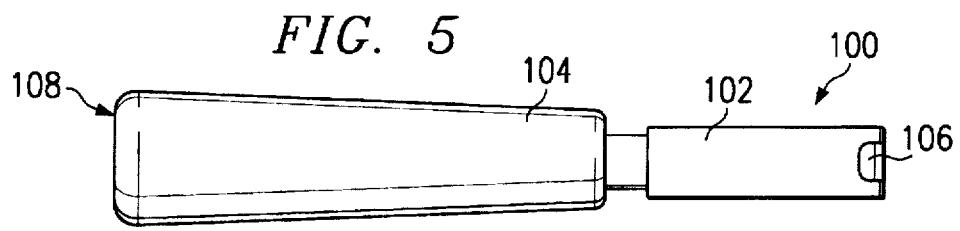
FIG. 5 is a side view of a groomer clip insertion tool.

Because it is important to ensure a good electrical contact of the cables 12 with the groomer fingers 30, the termination zones 32 of the cables 12 are tightly packed in the slot. Referring to FIG. 5, a groomer clip 60 installation tool 100 is used to install the clip 60 in the slot and to facilitate the exertion of adequate pressure to tightly pack the termination zones 32 of the cables 12 in the slot. The installation tool 100 includes a clip holder 102 and an impact handle 104. The clip holder 102 includes an end portion defining a shallow depression 106 on both sides thereof properly dimensioned to hold the flanges 81 of the groomer clip 60. The slight inward extension of the flanges 81 along with the depressions 106 enable the clip 60 to be temporarily held by the installation tool 100. The impact handle 104 further includes a flat and broad end 108 to facilitate the exertion of manual pressure thereon. The commercially available impact handle 104 may be calibrated to a pressure setting and provides an audible sound when pressure exerted against the flat end 108 of the handle 104 reaches the setting.

To install a groomer clip 60 in the slot, a pressure setting is calibrated in the impact handle 104. It has been shown, for example, that three impacts of approximately twenty pound pressure each provides adequate pressure to ensure a good electrical contact between the termination zones 32 of the cables 12 and the groomer fingers 30. The clip 60 is fastened or clipped onto the end of the clip holder 102 of the installation tool 100. The installation tool is then used to push the clip 60 into the slot against the termination zones 32 of the cables 12 and deliver the proper amount of pressure to impact the cables 12. Multiple impacts of predetermined pressure settings may be needed to adequately install the clip 60. When properly installed, good electrical contact in the termination zone 32 is achieved and the resistance between the foil shield 46 and the groomer finger 30 can be as low as 0.25 milliohms (m$\Omega$).

Figure 6:
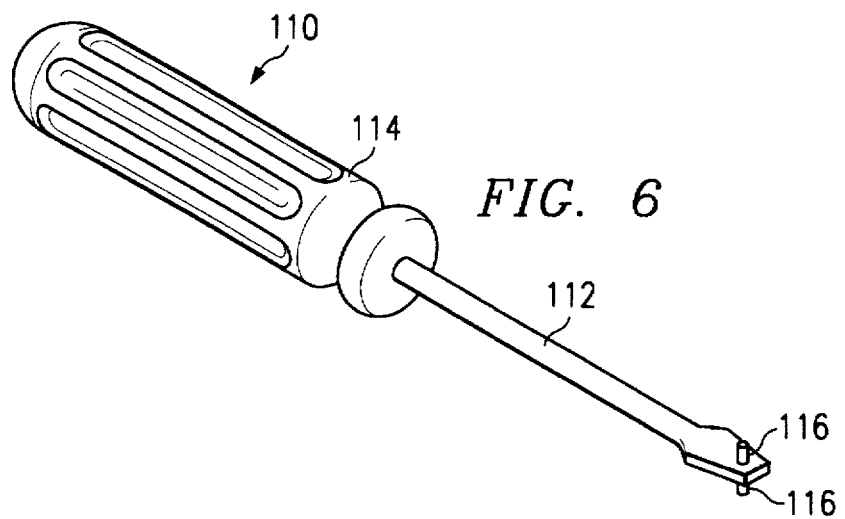
FIG. 6 is an isometric view of a groomer clip removal tool.

FIG. 6 shows the groomer clip removal tool 110. The removal tool 110 includes a blade 112 and a handle 114. Towards the end of the blade 112, one pin 116 protrudes from either side of the blade 112. The removal tool 110 may be constructed by modifying a screwdriver by inserting a hardened steel pin 116 into a hole formed in the blade 112 of the screwdriver. Referring also to FIG. 4, to use the removal tool 110 to remove the groomer clip 60 from the slot, the pins 116 on the blade 112 is inserted into the holes 90 on the flanges 81 of the clip 60. Since some space is reserved between the flanges 81 and the sides of the groomer fingers 30 due to the slight extension of the flanges toward one another, the pins 116 may be easily inserted into the holes 90. The removal tool 110 is then used to pull out the clip 60.

Accordingly, the cable EMI termination and shelf enclosure 10 of the present invention provides EMI termination for a large quantity of cables connected to an electronic shelf in a cost and space effective manner.

Although the present invention and its advantages have been described in detail, it should be understood that various changes, substitutions and alterations can be made therein without departing from the spirit and scope of the invention as defined by the appended claims.

What is claimed is:

1. A system for EMI shield termination of a plurality of cables connected to a piece of electronic equipment, comprising:

a backplane having at least four edges and a plurality of cable connectors arranged orderly on said backplane;

a plurality of conductive groomer fingers extending generally perpendicularly from said backplane and disposed along at least an edge of said backplane, each pair of said plurality of conductive groomer fingers defining an elongated slot therebetween;

said plurality of cables being coupled to said cable connectors on said backplane, said cables each having an EMI shield termination zone and being tightly packed into said elongated slots between said conductive groomer fingers for ensuring good electrical contact between said EMI shield termination zone of said cables and said conductive groomer fingers, wherein said EMI shield termination zones of more than one of said cables are packed tightly in each said elongated slot defined between two of said conductive groomer fingers; and a rear cover substantially covering and enclosing said backplane.

2. The system, as set forth in claim 1, wherein said EMI shield termination zone of each of said plurality of cables comprises an EMI foil shield being conductively exposed and in electrical contact with said conductive groomer fingers.

3. The system, as set forth in claim 1, wherein said EMI shield termination zone of each of said plurality of cables comprises:

a plurality of signal conductors;

a cable inner jacket surrounding said plurality of signal conductors;

an EMI foil shield surrounding said cable inner jacket; and a conductive tape fastened around said EMI foil shield for securing said EMI foil shield.

4. The system, as set forth in claim 3, wherein said EMI shield termination zone of each of said plurality of cables further comprises heat shrink sleeves securing any free ends of said conductive tape.

5. The system, as set forth in claim 1, further comprising a clip for installation in each said slot for ensuring said EMI shield termination zones of said cables are in intimate contact with said conductive groomer fingers.

6. The system, as set forth in claim 5, said clip comprises:

a back brace member; and a pair of flanges attached to said back brace member and extending substantially perpendicularly therefrom and forming a U therewith.

7. The system, as set forth in claim 6, wherein said back brace member includes:

a pair of upper tabs coupled to said back brace member for extending above said groomer fingers;

a pair of lower tabs coupled to said back brace member for extending below said groomer fingers; and said upper and lower tabs centering said clip in each said slot.

8. The system, as set forth in claim 6, wherein said back brace member includes:

a curvature along a longitudinal centerline, said back brace member with said curvature being generally wider than said elongated slot defined between two of said conductive groomer fingers; and side biting edges for exerting pressure against said groomer fingers and securing said clip in position.

9. The system, as set forth in claim 6, wherein said pair of flanges each includes an opening defined therein.

10. The system, as set forth in claim 6, wherein said pair of flanges extend toward one another.

11. The system, as set forth in claim 5, further comprising a clip installation tool, said clip installation tool comprises:

a clip holder for holding said clip; and an impact handle for exerting a predetermined amount of pressure on said clip and against said EMI shield termination zones in the slot.

12. The system, as set forth in claim 5, further comprising a clip removal tool, said clip removal tool comprises:

a blade having two sides, and a pin protruding from each of said sides thereof; and a handle.

13. The system, as set forth in claim 1, wherein each of said groomer fingers includes a hooked end portion, and said rear cover having a channel defined along one edge thereof for mating with said hooked end portions of said groomer fingers.

14. The system, as set forth in claim 13, wherein said rear cover further includes an EMI fingerstock coupled along said channel.

15. A cable EMI termination method for a plurality of EMI shielded cables to be connected to a piece of electronic equipment, comprising the steps of:

removing outer layers of said EMI shielded cables, exposing an EMI shield layer of each cable at an EMI shield termination zone defined therein, and removing said EMI shield layer of the cable beyond said EMI shield termination zone forming unshielded cable portions;

tightly packing said cables into elongated slots defined between conductive groomer fingers extending from said piece of electronic equipment, said exposed EMI shield at said EMI shield termination zone of each of said cables being in good electrical contact with said conductive groomer fingers, wherein said EMI shield termination zones of more than one of said cables are packed tightly in each of said elongated slots defined between two of said conductive groomer fingers;

connecting said unshielded cable portions to connectors located on said piece of electronic equipment; and substantially enclosing and shielding said unshielded cable portions and said connectors.

16. The method, as set forth in claim 15, wherein said cable outer layers removing step further includes the step of fastening a conductive tape around said exposed EMI shield layer.

17. The method, as set forth in claim 16, wherein said cable outer layers removing step further includes the step of fastening and securing edge of said conductive tape.

18. The method, as set forth in claim 17, wherein said fastening and securing step includes the step of heat shrinking a sleeve around each edge of said conductive tape for further securing thereof.

19. The method, as set forth in claim 15, wherein said cable tightly packing step further comprises the step of delivering at least one impact of a predetermined pressure onto said cables.

20. The method, as set forth in claim 15, wherein said cable tightly packing step further comprises the step of providing a stop against at least one cable packed in each of said elongated slots to ensure continued good electrical contact.

21. The method, as set forth in claim 15, wherein said cable tightly packing step further comprises the steps of:

positioning a clip in each of said elongated slots; and delivering at least one impact of a predetermined pressure onto said clip and cables.

22. The method, as set forth in claim 15, wherein said cable tightly packing step further comprises the steps of:

positioning a clip on an impact tool;

using said impact tool to deliver at least one impact of a predetermined pressure onto said clip and cables.

23. Apparatus for terminating EMI shields of a plurality of cables coupled to connectors disposed on a backplane of a piece of electronic equipment, comprising:

a plurality of parallel conductive groomer fingers being disposed along at least one edge of said backplane and extending therefrom, the groomer fingers defining elongated slots of a predetermined width therebetween;

said plurality of cables each having an EMI shield termination zone of an exposed conductive path to said respective EMI shields, said EMI shield termination zones being tightly packed in between said plurality of parallel groomer fingers in good electrical contact therewith, wherein said EMI shield termination zones of more than one of said cables are packed tightly in each of said elongated slots defined between two of said conductive groomer fingers; and an enclosure substantially covering said backplane.

24. The apparatus, as set forth in claim 23, wherein each said EMI shield zone comprises an EMI foil shield being conductively exposed.

25. The apparatus, as set forth in claim 23, further comprising a clip installed in each of said elongated slots for ensuring continued good electrical contact between said EMI shields and said conductive groomer fingers.

26. The apparatus, as set forth in claim 25, wherein said clip being expandable from a first width to a second width substantially equal to said predetermined slot width.

* * * * *